United States Patent [19]

Edwards

[11] Patent Number: 5,180,999
[45] Date of Patent: Jan. 19, 1993

[54] FILTER SYSTEM WITH CONTROLLED AMPLITUDE IN STOPBAND OR PASSBAND

[75] Inventor: Richard C. Edwards, Cedar Rapids, Iowa

[73] Assignee: Rockwell International Corporation, Seal Beach, Calif.

[21] Appl. No.: 589,744

[22] Filed: Sep. 28, 1990

[51] Int. Cl.⁵ .............................................. H03H 7/00
[52] U.S. Cl. .................................... 333/175; 333/117; 333/132; 333/176
[58] Field of Search ................ 333/167, 176, 175, 117, 333/126, 132, 112, 110, 136, 137

[56] References Cited

U.S. PATENT DOCUMENTS

| | | | |
|---|---|---|---|
| 1,736,814 | 11/1929 | Affel | 333/167 X |
| 2,875,283 | 2/1959 | Maione | 333/117 X |
| 2,938,084 | 5/1960 | Autrey | 333/117 X |
| 4,902,992 | 2/1990 | Rubin et al. | 333/126 |

*Primary Examiner*—Tod R. Swann
*Attorney, Agent, or Firm*—John J. Horn; M. Lee Murrah; H. Fredrick Hamann

[57] ABSTRACT

A filter system which may be configured either as a stopband (notch) or passband filter having controlled gain and low ripple throughout its stopband or passband. The system includes a filter network which is operative for splitting an input signal spectrum into a pair of complimentary spectrum components and a coupler for proportionately combining these spectrum components in accordance with a prescribed gain factor. The filter network may either comprise a pair of complimentary band reject and band pass filters connected to a common input terminal or a diplexer including identical filters coupled between a splitter and a combiner.

18 Claims, 3 Drawing Sheets

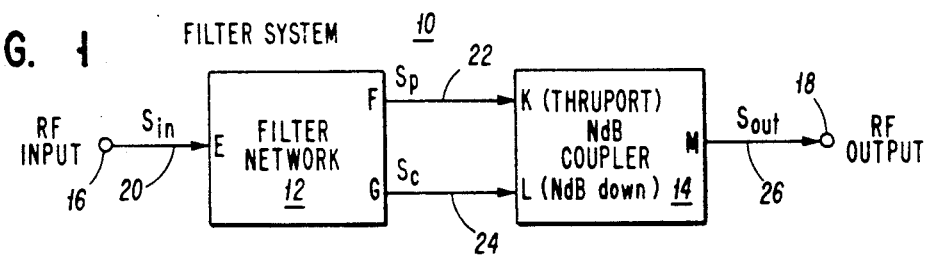
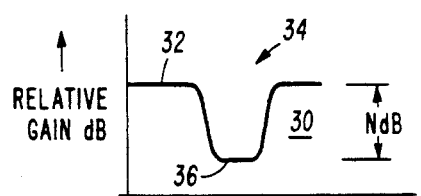
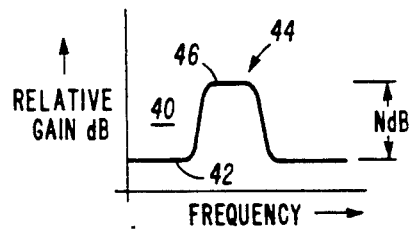
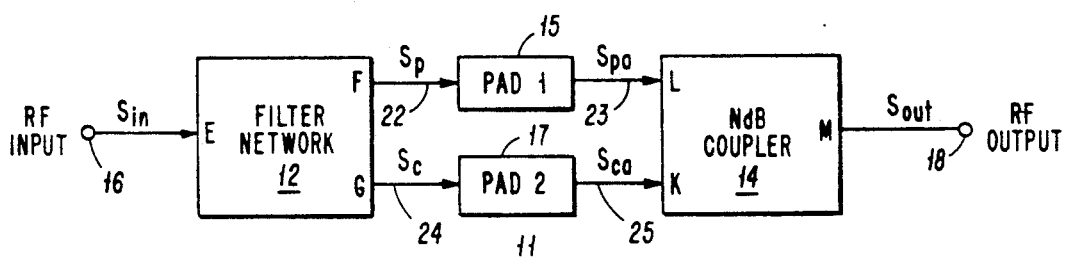
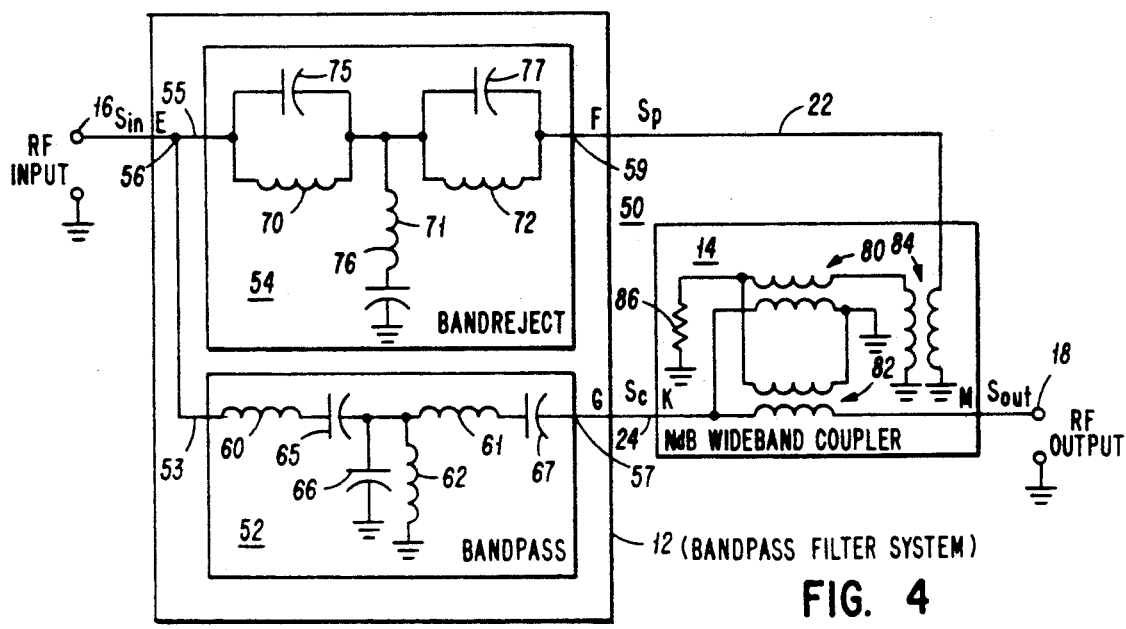

(BANDSTOP FILTER SYSTEM)

5,180,999

FILTER SYSTEM WITH CONTROLLED AMPLITUDE IN STOPBAND OR PASSBAND

BACKGROUND OF THE INVENTION

The present invention relates to electrical filters and more particularly to stopband (notch) and passband filters having controlled gain and low ripple.

The synthesis of wideband filters with controlled amplitude characteristics within a stopband or passband is a difficult design problem. The synthesis of such stopband and passband filters is further complicated in most circumstances because insertion losses must be kept low to prevent deterioration in the noise figure for receivers or wasted power output for transmitters. Also, 1:1 input VSWR is required to prevent reflected power from degrading the system performance within both the pass and stopbands of the filter. Filter networks exhibiting controlled amplitude characteristics have been constructed by using active devices to combine signals in prescribed manners. However, the performance of such networks is not acceptable for many applications because of their complexity, inherent intermodulation and harmonic distortion and because they require DC power sources.

It is therefore an object of the present invention to provide a filter system which may be configured either as a stopband (notch) or passband filter and which exhibits controlled amplitude characteristics such as prescribed gain and low ripple throughout the stopband or passband as the case may be.

It is another object of the present invention to provide a filter system which is a stand-alone device not requiring DC power sources and which has 1:1 input VSWR and low insertion losses.

It is a further object of the present invention to provide a filter system which is easy to realize with real world component values, uses standard filter synthesis techniques to provide the required filter elements and otherwise uses components which are readily available at reasonable cost.

SUMMARY OF THE INVENTION

The present invention constitutes a filter system which may be configured either as a stopband (notch) or a passband filter having controlled gain and low ripple throughout the stopband or passband of the system. The system includes a filter network which is operative for splitting an input signal spectrum into a pair of complimentary spectrum components and a coupler for proportionately combining these spectrum components in accordance with a prescribed gain factor. The filter network may either comprise a pair of complimentary bandpass and band reject filters connected to a common input terminal or a diplexer including identical filters coupled between a splitter and a combiner. In the preferred embodiment, a resistive pad may also be added between the filter network and the coupler for further controlling the gain of the system and especially the gain level at the floor of the stopband in a stopband filter and at the peak of the passband in a passband filter.

In operation, signals received at the input to the filter system are divided by the filter network into complimentary spectrum components in accordance with frequency. These complimentary spectrum components are then reassembled in prescribed proportions by the coupler in order to produce a combined output having the desired characteristics. The output reflects the frequency response of the filters included in the filter network with controlled amplitude and low ripple in the stopband or passband of the filter as the case may be. In particular, the increase or decrease in gain in the passband or stopband of the filter system is equal to the gain relationship between the inputs to the coupler. For example, if the coupler is constructed so that its inputs contribute to the output in a ratio of NdB then the floor of the stopband or the peak of the passband will reflect a decrease or increase of NdB in gain (actually an increase or decrease in loss) with respect to out-of-band frequencies.

BRIEF DESCRIPTION OF THE DRAWINGS

FIG. 1 provides an overall block diagram of the filter system of the present invention.

FIGS. 2A and 2B provide graphs of representative performance data for the alternative stopband (or notch) filter and passband filter configurations of the present invention.

FIG. 3 provides an overall block diagram of the system of the present invention including optional resistive pad components for further regulating the gain of the system.

FIG. 4 provides a combined block and schematic diagram of one embodiment of the present invention in which band reject and bandpass filters are employed as elements of the filter network component of the invention.

DESCRIPTION OF THE PREFERRED EMBODIMENT

Figure 5:
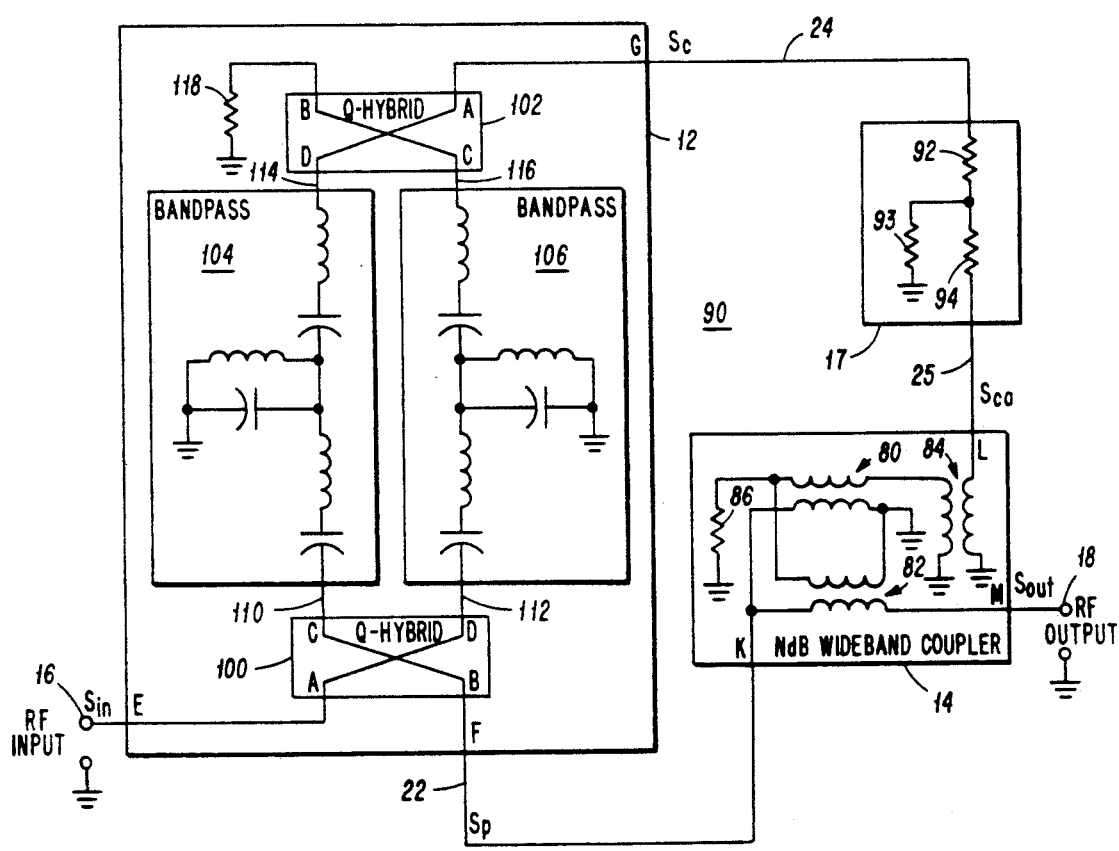
FIG. 5 provides a combined block and schematic diagram of another embodiment of the present invention in which identical bandpass filters are employed as elements of a diplexer forming the filter network component of the invention.

Referring now to FIG. 1, the filter system 10 of the present invention includes a filter network 12 and a directional coupler 14 interconnected for receiving and processing an RF input received at terminal 16 and providing an RF output at terminal 18. The RF input signal $S_{in}$ received at terminal 16 is supplied along line 20 to the port E of the filter network 12. The filter network 12 divides the spectrum of the input signal $S_{in}$ into two complimentary spectra which are output on ports F and G as the primary stopband and complimentary passband output signals $S_p$ and $S_c$, respectively. The transfer response between port E and port F is the complimentary response of the transfer response between port E and port G and vice versa. For example, if the filter response from port E to port F is bandstop and cornered at 2 and 4 MHz, then the complimentary response from port E to port G is bandpass and cornered at 2 and 4 MHz. It should also be noted that power not transferred from port E to port F is transferred from port E to port G and vice versa.

The signals $S_p$ and $S_c$ are supplied down lines 22 and 24 to the input ports K and L of the coupler 14. The coupler 14 is configured as a combiner for combining the signals $S_p$ and $S_c$ in unequal proportions in accordance with a gain factor NdB and provides an output signal $S_{out}$ at port M. The signal $S_{out}$ comprises a combination of the signals $S_p$ and $S_c$ weighted in accordance with the gain factor NdB. The coupler 14 comprises a conventional directional coupler having a thruport (input) port K, an NdB down input port L and an output port M. The coupler 14 employs transformers for combining input signals in a voltage proportional manner. The signal $S_{out}$ is supplied along the line 26 to the output terminal 18 and constitutes the RF output of the filter system 10. The filter system 10 is characterized by 1:1 input VSWR and low insertion loss.

The filter system 10 may be configured as a stopband (notch) filter or as a passband filter depending on the arrangements of the interconnections between the filter network 12 and the coupler 14. If the primary spectrum output signal $S_p$ of the filter network 12 is supplied to the thruport K of the coupler 14 while the complimentary spectrum output signal $S_c$ of the filter network 12 is supplied to the NdB down input port L of the coupler 14, then the filter system 10 operates as a stopband filter having the performance characteristics generally shown in FIG. 2A. If, on the other hand, the complimentary spectrum output signal $S_c$ is supplied to the thruport K of the coupler 14 while the primary spectrum output signal $S_p$ is supplied to the NdB down input port of the coupler 14, then the filter system 10 operates as a passband filter having the performance characteristics generally shown in FIG. 2B.

Referring now to FIG. 2A, the graph 30 depicts a plot 32 representative of the performance of the system 10 when it is configured as a stopband (notch) filter. Amplitude in the system stopband 34 is controlled for a decrease in gain (actually an increase in loss) of NdB and to provide a flat low ripple floor 36 in the stopband 34 of the filter. Referring now to FIG. 2B, the graph 40 depicts a plot 42 representative of the performance of the filter system 10 when it is configured as a passband filter. Amplitude in the system passband 44 is controlled to provide an increase in gain (actually a decrease in loss) of NdB and to provide a flat low ripple peak 46 in the passband 44 of the filter.

Referring now to FIG. 3, the filter system 11, which comprises a variation of system 10, includes the resistive pads 15 and 17 installed between the filter network 12 and the coupler 14 for attenuating the signals $S_p$ and $S_c$. The resistive pad 15 receives the primary spectrum output signal $S_p$ as input from port F of the filter network 12 on line 22 and provides an attenuated primary spectrum output signal $S_{pa}$ to the coupler 14 on line 23. The resistive pad 17 receives the complimentary spectrum output signal $S_c$ as input from port G of the filter network 12 on line 24 and provides an attenuated complimentary spectrum output signal $S_{ca}$ to the coupler 14 on line 25. It should be noted that since the complimentary spectrum output signal $S_{ca}$ is provided to the thruport K of the coupler while the primary spectrum output signal $S_{pa}$ is provided to the NdB down input port L of the coupler, the system 11 functions as a passband filter system. However, the pads 15 and 17 govern the exact levels of gain exhibited by the system 11. The pad 17 controls the level of gain in the passband of the filter system while the pad 15 controls the level of gain outside the system passband. If the amount of attenuation provided by the resistive pad 17 is equal to AdB, then the relative change in gain within the passband will be equal to AdB (the total loss is AdB within the system passband). If the amount of attenuation provided by the resistive pad 15 is equal to BdB then the relative change in gain outside the passband will be equal to BdB (the total loss is (N+B)dB outside the system passband). The resistive pads 15 and 17 may comprise either fixed resistive networks such as T or Pi sections or may comprise a set of networks providing different amounts of attenuation which may be switched in and out of operation using pin diodes or the like in order to provide variable attenuation and allow further control over the characteristics of the filter system 11.

Referring now to FIG. 4, a passband filter system 50 constructed in accordance with the principles of the present invention is shown as including a filter network 12 comprised of a passband filter 52 and a band reject (or stopband) filter 54. The inputs 53 and 55 to the filters 52 and 54, respectively, are connected to a common node 56 which corresponds to the input port E to the network 12 which is in turn connected to the input terminal 16 for receiving the RF input signal $S_{in}$. The outputs of 57 and 59 of the filters 52 and 54, respectively, correspond to the output ports G and F of the network 12. The passband filter 52 includes the inductors 60-62 and the capacitors 65-67. The band reject filter 54 includes the inductors 70-72 and the capacitors 75-77. The filters 52 and 54 comprise conventional passband and band reject filters which may be of any particular type (i.e., Chebyshev, Bessel, Butterworth, etc.) depending upon the values chosen for the inductors and capacitors.

The output of the passband filter 52 is the complimentary spectrum output signal $S_c$ which is supplied from the output port G of the network 12 along line 24 to the thruport K of the coupler 14. The output of the band reject filter 54 is the primary spectrum output signal $S_p$ which is supplied from the output port F of the network 12 along line 22 to the NdB down input port L of the coupler 14. The transformer 84 matches the output impedance of the filter 54 to the impedance of the coupler 14. The transformers 80 and 82 provide the desired coupling action for generating the output of the coupler 14 with the turns ratios of these transformers determining the gain relationship between the input ports K and L and the resultant weighting of the input signals as they are combined in forming the coupler's output signal. The resistor 86 serves as a dump resistance terminating the isolation port of the coupler 14 in its configuration as a combiner. The coupler 14 provides a weighted combination of the signals $S_p$ and $S_c$ on its output port M which comprises the output signal $S_{out}$ of the notch filter system 50 which is supplied to the RF output terminal 18 as the RF output of the system 50.

Referring now to FIG. 5, a bandstop (or notch) filter system 90 constructed in accordance with the principles of the present invention is shown as including a filter network 12 which constitutes a diplexer. The network or diplexer 12 is conventionally constructed and includes a pair of quadrature hybrid couplers 100 and 102 and a pair of identical passband filters 104 and 106 which are coupled between the hybrids 100 and 102. The quadrature hybrid 100 is configured as a splitter with its splitter input port A corresponding to the input port E of the diplexer 12 and its isolation port B corresponding to the output port F of the diplexer 12. The output ports C and D of the splitter 100 are connected by way of the lines 110 and 112 to the inputs to the bandpass filters 104 and 106, respectively. The quadrature hybrid 102 is configured as a combiner with its combiner output port A corresponding to the output port G of the diplexer 12 and its isolation port B being terminated in a dump resistance 118. The input ports C and D to the hybrid 102 are connected by way of the lines 114 and 116 to the outputs of the bandpass filters 104 and 106, respectively.

The diplexer 12 generates the primary spectrum output and complimentary spectrum output signals $S_p$ and $S_c$. The signal $S_p$ is furnished along line 22 to the coupler 14 while the signal $S_c$ is furnished along lines 24 and 25 to the coupler 14 by way of the resistive pad 17. The pad 17 includes the resistors 92, 93 and 94 which are operative for attenuating the signal $S_c$ by a factor AdB and reducing the level of gain (actually increasing the level of loss) in the system stopband to (N+A)dB. The primary spectrum output signal $S_p$ is supplied to the thruport K of the coupler 14 while the complimentary spectrum output signal $S_{ca}$ is supplied to the NdB down input port L of the coupler 14. As previously described with respect to FIG. 4, the coupler 14 includes an impedance matching transformer 84 and two coupling transformers 80 and 82 which combine the primary and complimentary spectrum output signals $S_p$ and $S_c$. The isolation port of the coupler 14 is terminated in a dump resistance 86. The coupler 14 provides the output signal $S_{out}$ comprising the RF output for the system 90 on its output port M which is connected to the RF output terminal 18 for the system 90.

Figure 6:
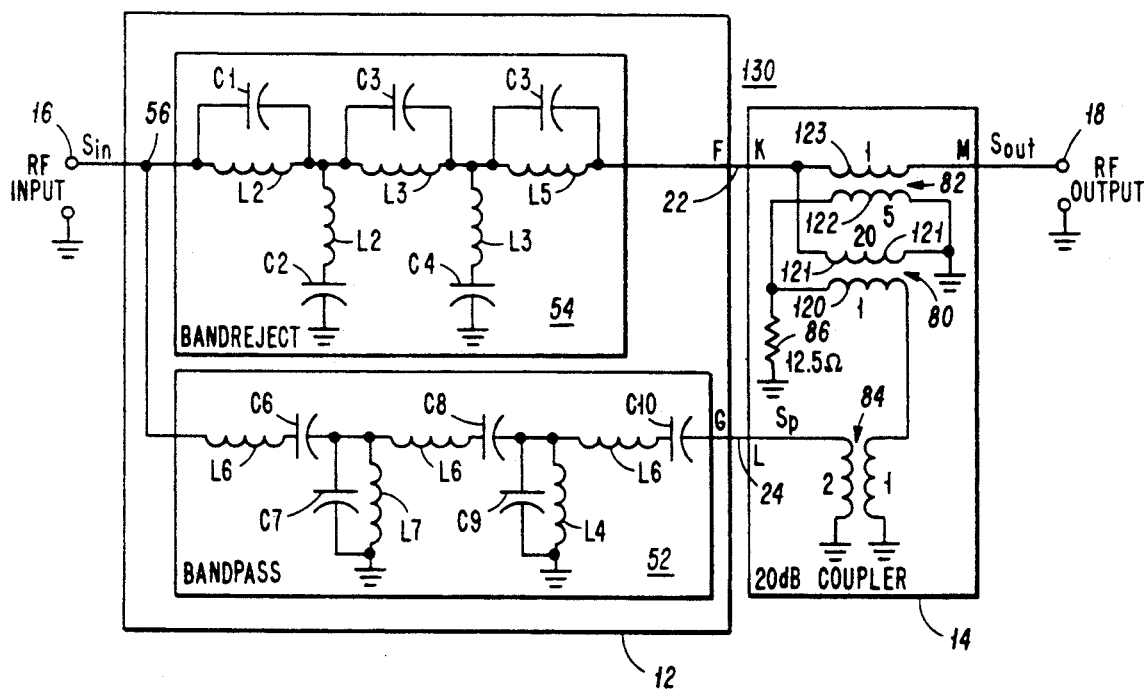
FIG. 6 provides a combined block and schematic diagram of a filter system in accordance with the present invention for which simulated performance data is shown in FIG. 7.
Figure 7:
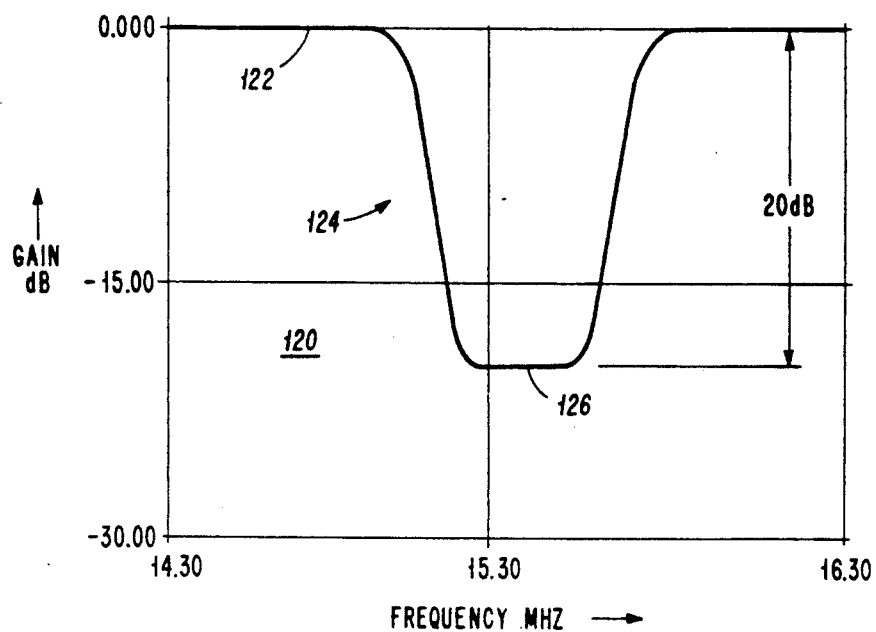
FIG. 7 provides a graph of simulated performance data for the filter system shown in FIG. 6 in accordance with the exemplary values of the elements listed in Table I.

Referring now to FIG. 6, a narrowband stopband (notch) system filter 130 is shown whose performance is illustrated in FIG. 7. The circuit 130 includes passband and band reject filters 52 and 54 having their inputs connected to a common node 56 linked to the RF input terminal 16 for receiving the system input signal $S_{in}$. The passband and band reject filters 52 and 54 comprise the filter network 12 and furnish a primary spectrum output signal $S_p$ on line 22 and a complimentary spectrum output signal $S_c$ on the line 24. The band reject filter 54 includes the capacitors C1-C5 and the inductors L1-L5 having the values shown in Table I and constituting a tenth order Butterworth band reject filter. The passband filter 52 includes the capacitors C6-C10 and the inductors L6-L10 having the values shown in Table I and forming a tenth order Butterworth band pass filter.

TABLE I

| BAND REJECT | BANDPASS |
|---|---|
| C1 = 3253. | L6 = 19415. |
| L1 = 33.26 | C6 = 5.574 |
| C2 = 7418. | C7 = 8515. |
| L2 = 14.59 | L7 = 12.71 |
| C3 = 3637. | L8 = 17367. |
| L3 = 29.75 | C8 = 6.231 |
| L4 = 14050. | C9 = 4496. |
| C4 = 7.702 | L9 = 24.07 |
| C5 = 16267. | L10 = 3883. |
| L5 = 6.653 | C10 = 27.87 |

(C values in pico farads, L values in micro henries)

The passband and band reject filters 52 and 54 are characterized by complimentary frequency performance. The primary spectrum output signal $S_p$ from the band reject filter 54 is passed to the thruport K of the coupler 14 while the complimentary spectrum output signal $S_c$ from the passband filter 52 is passed to the 20dB down input port L of the coupler 14. The coupler 14 includes the transformers 80 and 82 which provide the coupling action and an impedance matching transformer 84. The turns ratios of the coils 120 and 121, 122 and 123 (i.e., 1:20 and 5:1) provide the desired proportionality (i.e., 20dB difference) between the signals $S_p$ and $S_c$ in the output $S_{out}$ of the coupler 14. The output signal $S_{out}$ is furnished via port M to the output terminal 18 as the system RF output. It may be seen that the construction of the filter system 130 is substantially identical to the construction of the filter system 50 except that the particulars of the filters 52 and 54 and the coupler 14 have been specified in greater detail.

Referring now to FIG. 7, the graph 120 depicts the performance of the stopband filter system 130 as derived from a Touchstone computer simulation over the frequency range from 14.30 MHz to 16.30 MHz including the passbands and stopbands of the filters 52 and 54. The plot 122 shows gain in dB as a function of frequency in MHz. As illustrated, the system stopband 124 is characterized by a decrease in gain (increase in loss) of 20dB with a virtually flat low ripple floor 126.

While particular embodiments of the present invention have been shown and described, it should be clear that changes and modifications may be made to such embodiments without departing from the true scope and spirit of the invention. It is intended that the appended claims cover all such changes and modifications.

I claim:

1. A stopband filter system featuring −NdB of relative gain and low ripple throughout its stopband, comprising:
   a first passband filter for defining the bandwidth of said stopband and including an input connected to a common system input and a passband output;
   a second band reject filter having frequency characteristics complimentary to said first filter for further defining the bandwidth of said stopband and including an input connected to said common system input and a band reject output; and
   a NdB directional coupler configured as a combiner including a first thruport connected to said band reject output, a second NdB down input port connected to said passband output and a stopband system output.

2. The stopband filter system of claim 1, wherein said NdB directional coupler comprises a 20dB directional coupler and said filter system exhibits −20dB of relative gain in its stopband.

3. The stopband filter system of claim 1, further including a resistive pad installed between said first passband filter and said coupler for attenuating the output of said passband filter and further controlling the gain of said system in its stopband.

4. A stopband filter system featuring −NdB of relative gain and low ripple throughout its stopband, comprising:
   a splitter comprising a first quadrature hybrid coupler adapted for receiving system input and furnishing a primary spectrum output;
   a combiner comprising a second quadrature hybrid coupler adapted for furnishing a complimentary spectrum output;
   a pair of substantially identical bandpass filters coupled between said splitter and combiner for defining the bandwidth of said stopband; and
   a NdB directional coupler configured as a combiner including a first thruport connected for receiving said primary spectrum output, a second NdB down input port connected for receiving said complimentary spectrum output and a stopband system output.

5. The stopband filter of claim 4, wherein said NdB directional coupler comprises a 20 dB directional coupler and said filter system exhibits −20dB of relative gain in its stopband.

6. A passband filter system featuring NdB of relative gain and low ripple throughout its passband, comprising:
   a first passband filter for defining the bandwidth of said passband and including an input connected to a common system input and a passband output;
   a second band reject filter having frequency characteristics complimentary to said first filter for further defining the bandwidth of said passband and including an input connected to said common system input and a band reject output; and
   a NdB directional coupler configured as a combiner including a first thruport connected to said passband output, a second NdB down input port connected to said band reject output and a passband system output.

7. The passband filter system of claim 6, wherein said NdB directional coupler comprises a 20dB directional coupler and said filter system exhibits 20dB of relative gain in its passband.

8. The passband filter system of claim 6, further including a resistive pad installed between said second band reject filter and said coupler for attenuating the output of said band reject filter and further controlling the gain of said system in its passband.

9. A passband filter system featuring NdB of relative gain and low ripple throughout its passband comprising:
   a splitter comprising a first quadrature hybrid coupler adapted for receiving system input and furnishing a primary spectrum output;
   a combiner comprising a second quadrature hybrid coupler adapted for furnishing a complimentary spectrum output;
   a pair of substantially identical bandpass filters coupled between said splitter and combiner for defining the bandwidth of said passband; and
   a NdB directional coupler configured as a combiner including a first thruport connected for receiving said complimentary spectrum output, a second NdB down input port connected for receiving said primary spectrum output and a passband system output.

10. The passband filter of claim 9, wherein said NdB directional coupler comprises a 20 dB directional coupler and said filter system exhibits 20dB of relative gain in its passband.

11. A filter system featuring prescribed gain and low ripple in a controlled amplitude band, comprising:
   means for dividing the frequency spectrum of an input signal into a primary spectrum output and a complimentary spectrum output and defining the bandwith of said controlled amplitude band; and
   a NdB directional coupler configured as a combiner and including a first thruport connected for receiving one of said spectrum outputs, a second NdB down input port connected for receiving the other of said spectrum outputs and a filter system output.

12. The filter system of claim 11, wherein said means for dividing the frequency spectrum of an input signal comprises a diplexer.

13. The filter system of claim 12, wherein said diplexer includes:
   a splitter comprising a first quadrature hybrid coupler connected for receiving input to said filter system and furnishing said primary spectrum output,
   a combiner comprising a second quadrature hybrid coupler connected for furnishing said complimentary spectrum output, and
   a pair of substantially identical bandpass filters coupled between said splitter and combiner for defining the bandwidth of said controlled amplitude band.

14. The filter system of claim 11, wherein said NdB directional coupler comprises a 20 dB directional coupler and said filter system exhibits 20dB of relative gain in its controlled amplitude band.

15. The filter system of claim 11, wherein said means for dividing the frequency spectrum of an input signal comprises:
   a first passband filter for defining the bandwidth of said controlled amplitude band and including an input connected to a common system input and a complimentary spectrum passband output, and
   a second band reject filter having frequency characteristics complimentary to said first passband filter for further defining the bandwidth of said controlled amplitude band and including an input connected to said common system input and a primary spectrum stopband output.

16. The filter system of claim 15, wherein said NdB directional coupler comprises a 20 dB directional coupler and said filter system exhibits 20dB of relative gain in its controlled amplitude band.

17. The filter system of claim 11, wherein said primary spectrum output is connected to said thruport and said complimentary spectrum output is connected to said NdB down input port and said filter system comprises a stopband filter system.

18. The filter system of claim 11, wherein said complimentary spectrum output is connected to said thruport and said primary spectrum output is connected to said NdB down input port and said filter system comprises a passband filter system.

* * * * *